US 8,464,421 B2

(12) United States Patent
Yagi et al.

(10) Patent No.: US 8,464,421 B2
(45) Date of Patent: Jun. 18, 2013

(54) ELECTRONIC COMPONENT MOUNTING DEVICE

(75) Inventors: Shuzo Yagi, Yamanashi (JP); Takeyuki Kawase, Yamanashi (JP); Yoshiyuki Kitagawa, Yamanashi (JP); Naoto Kohketsu, Yamanashi (JP); Nobuhiro Nakai, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/392,712

(22) PCT Filed: Oct. 14, 2010

(86) PCT No.: PCT/JP2010/006120
§ 371 (c)(1),
(2), (4) Date: Feb. 27, 2012

(87) PCT Pub. No.: WO2011/045939
PCT Pub. Date: Apr. 21, 2011

(65) Prior Publication Data
US 2012/0151761 A1 Jun. 21, 2012

(30) Foreign Application Priority Data
Oct. 14, 2009 (JP) ................................. 2009-236929

(51) Int. Cl.
*B23P 19/00* (2006.01)
(52) U.S. Cl.
USPC ............... 29/740; 29/760; 29/33 P; 29/564.1; 29/742; 198/468.3
(58) Field of Classification Search
USPC .. 713/320; 29/739–743, 832–834; 198/346.1, 198/346.4, 468.1
See application file for complete search history.

(56) References Cited

U.S. PATENT DOCUMENTS

| 4,697,318 A | * | 10/1987 | Wickham et al. ............... 29/33 P |
| 4,708,232 A | * | 11/1987 | Hata et al. .................... 198/346.1 |
| 5,205,026 A | * | 4/1993 | Sticht ............................. 29/33 P |

(Continued)

FOREIGN PATENT DOCUMENTS

| JP | 62-42597 A | 2/1987 |
| JP | 05-055787 A | 3/1993 |

(Continued)

OTHER PUBLICATIONS

International Search Report for PCT/JP2010/006120 dated Nov. 9, 2010.

*Primary Examiner* — Minh Trinh
(74) *Attorney, Agent, or Firm* — Pearne & Gordon LLP

(57) ABSTRACT

A substrate conveyor track is provided with first to fourth conveyors. Two conveyors situated on both sides of the substrate conveyor track, and the other two conveyors situated at the center of the same. There is enabled selection of any one from a small substrate mounting mode for giving a single substrate conveyance width to the four conveyors and mounting electronic components on four small substrates having the single width; a large substrate mounting mode for actuating all movable conveyors to the center of the substrate conveyor track and mounting electronic components on two large substrates by the two conveyors; and a large-small-substrates mounting mode for bringing the two conveyors on one side of the substrate conveyor track, among the four conveyors, into the small substrate mounting mode and bringing one of the conveyors on the other side of the track into the large substrate mounting mode.

3 Claims, 5 Drawing Sheets

U.S. PATENT DOCUMENTS

| | | | |
|---|---|---|---|
| 6,378,198 B1 * | 4/2002 | Asai et al. | 29/825 |
| 7,200,922 B2 * | 4/2007 | Kabeshita et al. | 29/740 |
| 2004/0033128 A1 | 2/2004 | Kabeshita et al. | |
| 2004/0128827 A1 | 7/2004 | Shimizu et al. | |
| 2006/0000085 A1 | 1/2006 | Kabeshita et al. | |
| 2009/0250313 A1 * | 10/2009 | Kimura et al. | 198/465.1 |
| 2010/0050426 A1 | 3/2010 | Shimizu et al. | |
| 2012/0272511 A1 * | 11/2012 | Kawase et al. | 29/592.1 |
| 2012/0285012 A1 * | 11/2012 | Kawase et al. | 29/832 |

FOREIGN PATENT DOCUMENTS

| | | |
|---|---|---|
| JP | 2001-313492 A | 11/2001 |
| JP | 2004-128400 A | 4/2004 |
| WO | 02/17699 A1 | 2/2002 |
| WO | 2009/077558 A1 | 6/2009 |

* cited by examiner

ELECTRONIC COMPONENT MOUNTING DEVICE

TECHNICAL FIELD

The present invention relates to an electronic component mounting apparatus and an electronic component mounting method that make it possible to flexibly mount electronic components on a small substrate or a large substrate.

BACKGROUND ART

In an electronic component mounting apparatus that mounts electronic components on a substrate, like a printed board, a component feed unit, such as a tape feeder, is disposed beside a substrate conveyor track built from a conveyor, like a belt conveyor. A mount head picks up electronic components from the component feed unit and mounts the components at predetermined coordinate positions on the substrate.

Substrates vary in size from small to large. With a view toward addressing a change in substrate size, the substrate conveyor track is made up of a stationary path and a movable path that are parallel to each other. The stationary path and the movable path each are built by winding a conveyor belt around a guide rail. The stationary path serves as a fiducial path for positioning a substrate when a side end face of the substrate is pressed against the stationary path. Further, the movable path advances or recedes with respect to the stationary path, whereby a width (spacing between the stationary path and the movable path) of the substrate conveyor track can be controlled in accordance with a width of the substrate.

RELATED ART DOCUMENT

Patent Document

Patent Document 1: JP-A-05-055787

SUMMARY OF THE INVENTION

Problem that the Invention is to Solve

Substrates vary in size from small substrates, like circuit boards for use in portable phones, to large substrates, like circuit boards for use in personal computers. In an electronic industry, production styles have recently become diversified, so that production has increasingly been performed while being switched, as required, between high-volume production of one type of a product and low-volume production of multiple types of products. As a matter of course, a further reduction in takt time and greater enhancement of productivity have been desired. To this end, it is desirable that setup switching between a small substrate and a large substrate will be smoothly performed without a delay.

Accordingly, the present invention aims at providing an electronic component mounting apparatus and an electronic component mounting method that make it possible to increase a degree of freedom of operation for mounting electronic components on small and large substrates, to smoothly switch between a setup of a small substrate and a setup of a large substrate without a delay, and to enhance productivity.

Means for Solving the Problem

An electronic component mounting apparatus of the present invention includes a substrate conveyor track, a first component feed unit and a second component feed unit that are disposed on both sides of the substrate conveyor track, and first and second transfer heads that convey and mount electronic components put in the first and second component feed units to substrates positioned on the substrate conveyor track, wherein the substrate conveyor track is provided with first through fourth conveyors laid side by side in parallel to each other; wherein two of the four conveyors, located closely to both sides of the substrate conveyor track, are an externally fiducial/internally movable conveyor; and wherein center two conveyors are an internally fiducial/externally movable conveyor.

An electronic component mounting method of the present invention uses the electronic component mounting apparatus and makes it possible to selectively perform processing pertaining to any one of modes; namely, a small substrate mounting mode for giving an equal substrate conveyance width to the four conveyors and mounting electronic components on four small substrates having a single width;

a large substrate mounting mode for actuating all movable conveyors to the center of the substrate conveyor track and mounting electronic components on two large substrates by means of the remaining two conveyors; and a large-small-substrates mounting mode for setting widths of two conveyors on one side of the substrate conveyor track, among the four conveyors, to the same substrate conveyance width as that employed in the small substrate mounting mode, thereby mounting electronic components on the two small substrates and also for actuating movable conveyors of the remaining externally fiducial/internally movable conveyor closely to the center of the substrate conveyor track, to thus set the width of one of the remaining conveyors to the same substrate conveyance width as that employed in the large substrate mounting mode, thereby mounting electronic components on the large substrate.

The electronic component mounting method of the present invention preferably includes a substrate sorter disposed at an upstream position with respect to the substrate conveyor track, wherein, in the small substrate mounting mode, the substrate sorter preferentially feeds substrates to conveyors located in proximity to the respective component feed units than to the conveyors located at the center of the substrate conveyor track that are distant from the respective component feed units.

Advantages of the Invention

The substrate conveyor track of the present invention includes four conveyors. Movable paths of the respective conveyors are caused to advance to or recede from their counterpart stationary paths. Widths between the stationary paths and the movable paths are thereby changed according to a size of a substrate to be mounted. It is possible to select any one from three mounting modes; namely, a small substrate mounting mode, a large substrate mounting mode, and a large-small-substrates mounting mode. Therefore, a high degree of freedom of operation responsive to a change in substrate size can be assured. Further, setup switching involving a change in substrate size can also be smoothly performed without a delay.

In the large substrate mounting mode, the stationary paths serving as fiducial substrate positions are situated on the outside of the substrate conveyor track (i.e., in the proximity of the respective component feed units). Distances that the transfer heads need to travel to mount electronic components are further reduced, so that shortening of takt time and enhancement of productivity can be accomplished.

EMBODIMENT FOR IMPLEMENTING THE INVENTION

Figure 1:
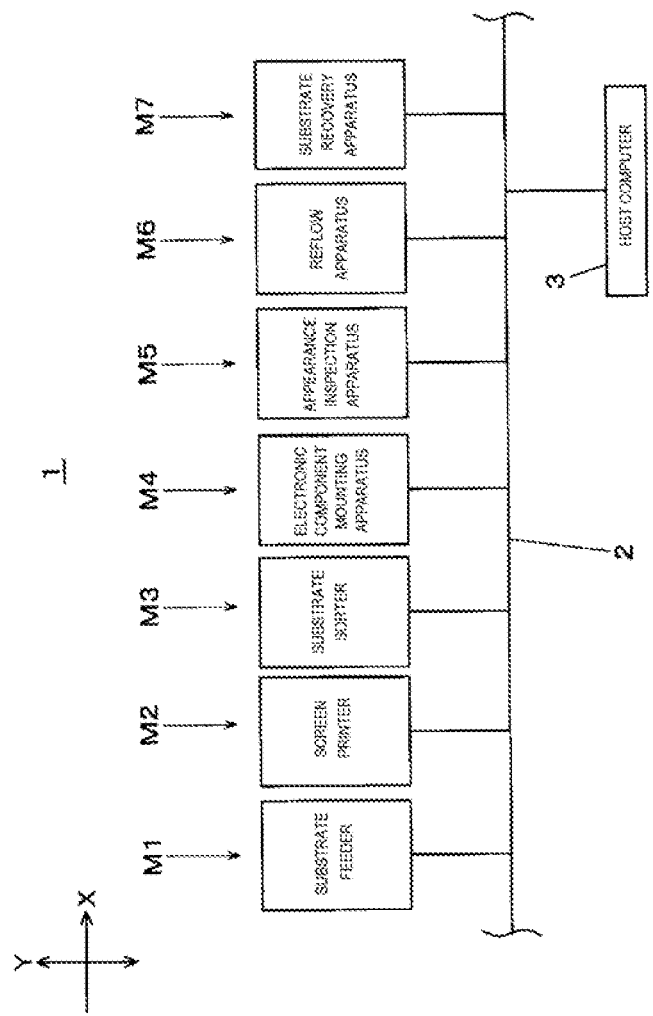
FIG. 1 is a descriptive block diagram of an electronic component mounting system of an embodiment of the present invention.

First, an overall configuration of an electronic component mounting system 1 is described by reference to FIG. 1. A variety of apparatuses, like a substrate feeder M1, a screen printer M2, a substrate sorter M3, an electronic component mounting apparatus M4, an appearance inspection apparatus M5, a reflow apparatus M6, and a substrate recovery apparatus are arranged side by side. These apparatuses are connected to a host computer 3 by means of a LAN 2, whereby the entirety of the system is controlled.

The substrate feeder M1 feeds a substrate kept in a magazine, or the like, to the screen printer M2. The screen printer M2 coats electrodes of an electronic circuit of a substrate with paste solder. A type of screen printer that has a plurality of squeegee units and that simultaneously prints paste solder to a plurality of substrates can also be applied to the screen printer M2.

The substrate sorter M3 sorts substrates delivered from the screen printer M2 into four conveyors (which will be described later) of a substrate conveyor track of the electronic component mounting apparatus M4. The electronic component mounting apparatus M4 mounts the electronic components held in parts feeders of a component feed unit to a predetermined coordinate position on each of the substrates.

The appearance inspection apparatus M5 checks an appearance of electronic components mounted on the substrate; delivers a good substrate to the next reflow apparatus M6; and carries a no-good substrate out of a line. The reflow apparatus M6 dissolves and solidifies the paste solder by means of a heating furnace, to thus solder the electronic components. The substrate recovery apparatus M7, like a magazine, recovers the substrate thus mounted with the electronic components.

Figure 2:
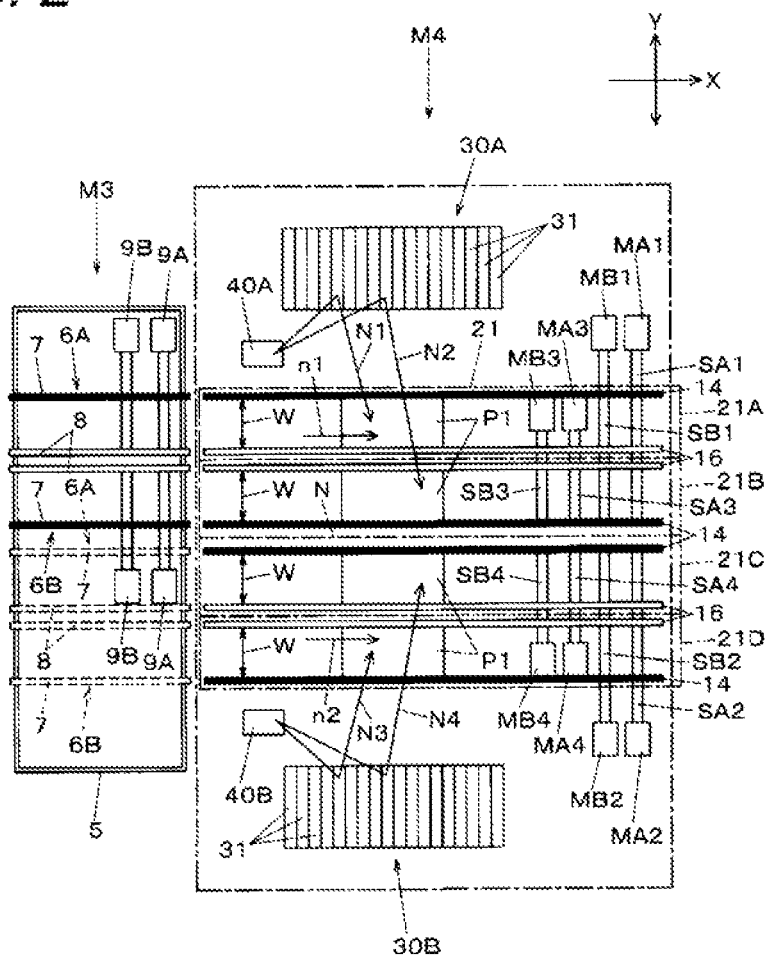
FIG. 2 is a plan view of an electronic component mounting apparatus of the embodiment of the present invention.

First, the substrate sorter M3 is described. In FIG. 2, the substrate sorter M3 is a known sorter, and a first sorting conveyor 6A and a second sorting conveyor 6B are disposed side by side on a bench 5. The first sorting conveyor 6A and the second sorting conveyor 6B are structurally identical with each other, and each sorting conveyor has a stationary (positional criterion) conveyor 7 and a movable conveyor 8 that are parallel to each other. The substrate sorter has a conveyor motor 9A for actuating and conveying the stationary conveyor 7 and the movable conveyor 8 and a widthwise actuation motor 9B for letting the movable conveyor 8 advance to or recede from the stationary conveyor 7. Further, the first conveyor 6A and the second conveyor 6B are actuated by means of an actuating mechanism (not shown) provided on the bench 5, to thus travel between a position of a solid line and a position of a broken line (i.e., between an upper position and a lower position in FIG. 2) along a direction Y. In the present invention, a direction of conveyance of the substrate is taken as a direction X, whilst a direction orthogonal to the direction X within a horizontal plane is taken as the direction Y.

Next, the electronic component mounting apparatus M4 is now described. In FIG. 2, the electronic component mounting apparatus M4 is provided with component feed units 30A and 30B disposed on both sides (the outside) of a substrate conveyor track 21. Each of the component feed units 30A and 30B is provided with parts feeders 31, like tape feeders and tube feeders, disposed side by side. FIG. 2 shows a small substrate mounting mode for mounting electronic components on four small substrates P1 positioned respectively on the four conveyors 21A to 21D of the substrate conveyor track 21.

A first transfer head 40A and a second transfer head 40B are actuated by a movable table mechanism (not shown), to thus horizontally move in both the directions X and Y. The first transfer head 40A picks up electronic components from the parts feeders 31 of the component feed units 30A and mounts the thus-picked-up electronic components at predetermined coordinate positions on the substrates (the small substrates P1 of the embodiment) positioned on the substrate conveyor track 21 (designated by arrows N1 and N2). The second transfer head 40B picks up electronic components from the parts feeders 31 of the component feed units 30B and mounts the thus-picked-up electronic components at predetermined coordinate positions on the small substrates P1 (designated by arrows N3 and N4).

Figure 5:
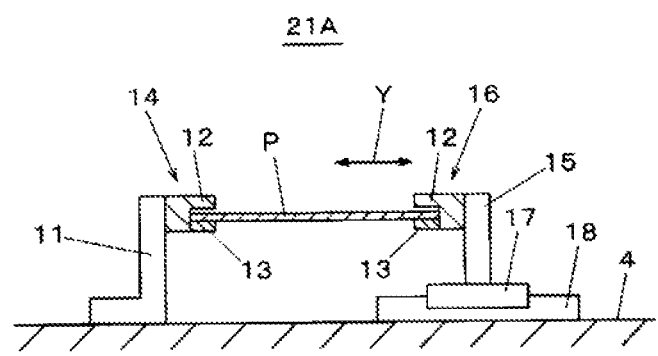
FIG. 5 is a cross sectional view of a substrate conveyor track of the electronic component mounting apparatus of the embodiment of the present invention.

The substrate conveyor track 21 is now described. In FIG. 2, the substrate conveyor track 21 is provided with the four conveyors (i.e., the first conveyor 21A, the second conveyor 21B, the third conveyor 21C, and the fourth conveyor 21D) disposed side by side on a bench 4 (which will be described later) of the electronic component mounting apparatus M4. The first to fourth conveyors 21A to 21D are structurally identical with each other. Hence, the structure of the conveyor is now described by reference to FIG. 5 while the first conveyor 21A is taken as an example.

A first frame 11, having an inverted L-shaped cross sectional profile, stands as a fixed block on an upper surface of the bench 4. A guide rail 12 is fitted to an interior surface of an upper portion of the first frame, and a belt conveyor 13 is mounted in the guide rail 12. The guide rail 12 and the belt conveyor make up a stationary path 14 whose position is fixed. A side end face of the substrate P is pressed against the stationary path, so that the stationary path works as a fiducial position for the substrate. Thus, the substrate P is positioned.

A second frame 15 spaced apart from, while being aligned parallel to, the first frame 11. The guide rail 12 is fitted to an interior surface of an upper portion of the second frame 15, and the belt conveyor 13 is mounted in the guide rail 12. A slider 17 is attached to a lower portion of the second frame 15. The slider 17 is slidably placed on a long guide rail 18 along the direction Y set on the bench 4. Therefore, the second frame 15 is movable in the direction Y. The guide rail 12 and the conveyor 13 attached to the second frame make up a movable path (a movable conveyor) 16 that can advance to or recede from the stationary path along the direction Y (the widthwise direction of the substrate).

In FIG. 2, the first to fourth conveyors 21A to 21D convey the respective substrates P1 in the direction X (rightward in FIG. 2). In the present invention, a direction of conveyance of the substrates P1 is taken as the direction X, whereas a direction orthogonal to the direction X within a plane is taken as the direction Furthermore, in FIG. 2, the stationary path 14 is solid filled in black, whilst the movable path outlined.

In FIG. 2, the first to fourth conveyors 21A to 21D have conveyor motors MA1 to MA4 for actuating conveyor belts of the respective conveyors and widthwise actuation motors MB1 to MB4 that cause the movable path 16 to advance to or recede from the stationary path 14 parallel to the movable path, according to a width of a substrate. Reference numerals SA1 to SA4 denote rotary shafts of the conveyor motors MA1 to MA4, and reference numerals SB1 to SB4 denote ball screws that are rotatively actuated by means of the widthwise motors. These conveyor means and widthwise actuation means have already been known.

In FIG. 2, the first conveyor 21A and the fourth conveyor 21D situated on both sides of the substrate conveyor track 21 make up an externally fiducial-internally movable conveyor including the stationary paths 14 situated on both external sides of the substrate conveyor track 21 (in the proximity of the component feed units 30A and 30B) and the movable paths 16 situated on the inside of the same (in the proximity of a center N of the substrate conveyor track 21). Moreover, the two conveyors situated at the center of the substrate conveyor track 21; namely, the second conveyor 21B and the third conveyor 21C, make up an internally fiducial-externally movable conveyor including the stationary paths 14 situated closely to the center N of the substrate conveyor track 21 and the movable paths 16 situated closely to the outside of the same. In FIG. 2, all widths W of the first through fourth conveyors 21A to 21D are equal to each other and convey the small substrate P1. The substrates P1 are positioned to respective predetermined mounting positions by means of clampers (not shown), or the like.

In FIG. 2, the first transfer head 40A mounts the electronic components of the component feed unit 30A onto the substrates P1 (as designated by arrows N1 and N2), and the second transfer head 40B mounts the electronic components of the component feed unit 30B onto the substrates P1 (as designated by arrows N3 and N4). A method for operating both of the transfer heads 40A and 40B can be freely determined. Consequently, in FIG. 2, the first transfer head 40A may mount electronic components on the upper two substrates P1, and the second transfer head 40B may mount electronic components on the lower two substrates P1. Alternatively, the two transfer heads 40A and 40B may mount, in cooperation with each other, electronic components on the single substrate P1.

In FIG. 2, the substrates P1 are positioned on all of the first through fourth conveyors 21A to 21D having the same width W, and electronic components are simultaneously mounted on the four substrates P1. However, the substrates P1 can be positioned on only two of the four conveyors 21A to 21D, and electronic components can be mounted on these two substrates. In this case, the substrates P1 are positioned on the first conveyor 21A and the fourth conveyor 21D located in the proximity of the respective component feed units 30A and 30B, and the second and third conveyors 21B and 21C are left empty.

As mentioned above, the substrates P1 are positioned on the first conveyor 21A and the fourth conveyor 21D located in the proximity of the component feed units 30A and 30B. The first transfer head 40A mounts electronic components on the substrate P1 on the first conveyor 21A, and the second transfer head 40B mounts electronic components on the substrate P1 on the fourth conveyor 21D. As a result, distances over which both transfer heads 40A and 40B need to travel to mount electronic components (a distance between the component feed unit 30A and the substrate P1 positioned on the first conveyor 21A and a distance between the component feed unit 30B and the substrate P1 positioned on the fourth conveyor 21D) can be shortened, to thus reduce the takt time. Accordingly, productivity can be enhanced. As above, when electronic components are mounted on the respective substrates P1 on the first and fourth conveyors 21A and 21D, the substrate sorter M3 preferentially sorts and feeds the substrates P1 to the first conveyor 21A and the fourth conveyor 21D as designated by arrows n1 and n2.

Figure 3:
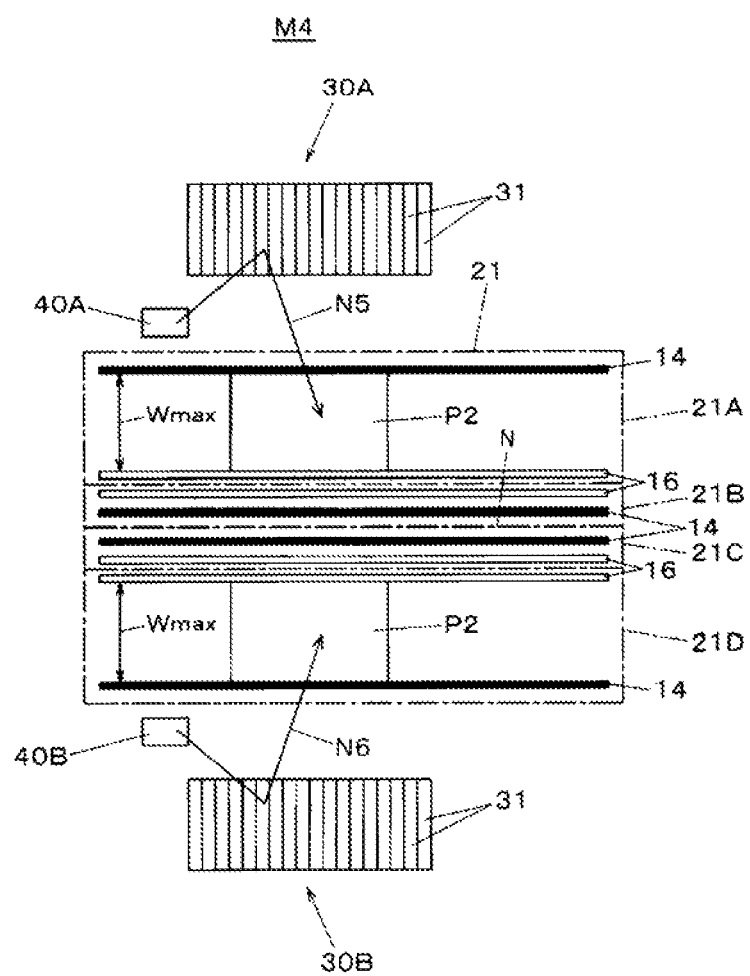
FIG. 3 is a plan view of the electronic component mounting apparatus of the embodiment of the present invention.

FIG. 3 shows a plan view of the substrate conveyor track 21 in a large substrate mounting mode. In this mode, all of the movable paths (the movable conveyors) 16 are actuated closely to the center N of the substrate conveyor track 21, thereby maximizing the width of the respective conveyors on both sides of the substrate conveyor track (i.e., the first conveyor 21A and the fourth conveyor 21D) to Wmax. Electronic components are mounted on two large substrates P2 positioned on the respective two conveyors 21A and 21D. Employed in this mode are only the first conveyor 21A located in proximity to the first component feed unit 30A and the fourth conveyor 21D located in proximity to the second component feed unit 30B. The second conveyor 21B and the third conveyor 21C, located in the proximity of the center N of the substrate conveyor track 21, are set to a smaller conveyance width and left unused.

Specifically, a spacing between the stationary path 14 and the movable path 16 of the first conveyor 21A and a spacing between the stationary path 14 and the movable path 16 of the fourth conveyor 21D are broadened to the maximum width Wmax, whereby the large substrates P2 are positioned. In the meantime, a spacing between the stationary path 14 and the movable path 16 of the second conveyor 21B and a spacing between the stationary path 14 and the movable path 16 of the third conveyor 21C are formed with the minimum width, whereby substrates are not positioned. Both of the transfer heads 40A and 40B accordingly mount electronic components on both of the large substrates P2 (as designated by arrows N5 and N6). Even in this case, the large substrates P2 are pressed against the respective stationary paths 14 in the proximity of the respective component feed units 30A and 30B of both of the conveyors 21A and 21D, to thus be positioned. Therefore, both of the transfer heads 40A and 40B can transfer and mount the electronic components of the component feed units 30A and 30B to predetermined coordinate positions on the large substrates P2 over shorter travel distances.

Figure 4:
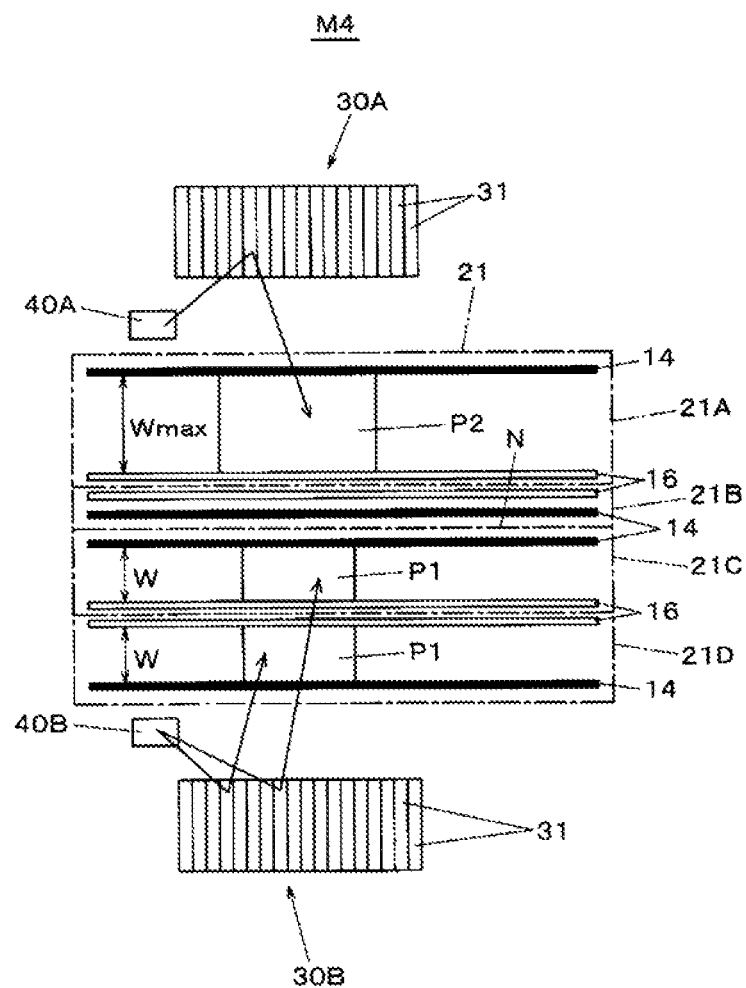
FIG. 4 is a plan view of the electronic component mounting apparatus of the embodiment of the present invention.

FIG. 4 shows a large-small-substrates mounting mode for mounting electronic components on the respective large substrates P2. In this mode, the width of the two conveyors 21C and 21D situated on one side (a lower side in FIG. 4) of the track, among the four conveyors 21A to 21D, is set to the substrate conveyance width W that is the same as that employed in the small substrate mounting mode shown in FIG. 2. Electronic components are mounted on two small substrates P1. The movable conveyors 16 on the other side (i.e., an upper side in FIG. 4) is actuated closely to the center N, thereby setting the width of the conveyor 21A to the substrate conveyance width Wmax that is the same as that employed in the large substrate mounting mode shown in FIG. 3. As a matter of course, in FIG. 4, the upper two conveyors 21A and 21B may be brought into the small substrate mounting mode, and the lower conveyor may be brought into the large substrate mounting mode.

The large-small-substrates mounting mode (a mixed large-small-substrates mode shown in FIG. 4) yields the advantage of the ability to smoothly carry out setup switching while minimizing a drop in operating efficiency of the electronic component mounting apparatus when a mode is changed from the small substrate mounting mode to the large substrate mounting mode or when the large substrate mounting mode is reversely changed to the small substrate mounting mode; namely, when setup switching between a small substrate and a large substrate that involves a change in substrate size is performed.

The present patent application is based on Japanese Patent Application (JP-2009-236929) filed on Oct. 14, 2009, the entire subject matter of which is incorporated herein by reference.

INDUSTRIAL APPLICABILITY

The substrate conveyor track of the present invention includes four conveyors. Movable paths of the respective conveyors are caused to advance to or recede from their counterpart stationary paths. Widths between the stationary paths and the movable paths are thereby changed according to a size of a substrate to be mounted. Since it is thus possible to select any one from three mounting modes; namely, a small substrate mounting mode, a large substrate mounting mode, and a small-large-substrates mounting mode, a high degree of freedom of operation commensurate with a change in substrate size can be assured. Moreover, setup switching involving a change in substrate size can also be smoothly performed without a delay.

Furthermore, in the large-substrate mounting mode, the stationary path serving as a fiducial substrate position is placed on the outside of the substrate conveyor track (i.e., a position close to the component feed unit). Thereby, a travel distance that the transfer head needs to mount electronic components is further shortened, to thus be able to shorten the takt time and enhance productivity.

DESCRIPTIONS OF THE REFERENCE NUMERALS AND SYMBOLS

M3 substrate sorter
M4 electronic component mounting apparatus
P1 small substrate
P2 large substrate
21 substrate conveyor track
21A first conveyor
21B second conveyor
21C third conveyor
21D fourth conveyor
30A first component feed unit
30B second component feed unit
40A first transfer head
40B second transfer head

The invention claimed is:

1. An electronic component mounting apparatus comprising a substrate conveyor track, a first component feed unit and a second component feed unit that are disposed on both sides of the substrate conveyor track, and first and second transfer heads that convey and mount electronic components put in the first and second component feed units to substrates positioned on the substrate conveyor track, wherein
   the substrate conveyor track is provided with first through fourth conveyors laid side by side in parallel to each other; wherein
   each of two external conveyors of the four conveyors, located closely to both sides of the substrate conveyor track, includes a stationary path situated closer to either one of external sides of the substrate conveyor track and a movable path situated closer to a center of the substrate conveyor track; and wherein
   each of remaining two center conveyors includes a stationary path situated closer to the center of the substrate conveyor track and a movable path situated closer to either one of the external sides of the substrate conveyor track.

2. The electronic component mounting apparatus according to claim 1, further comprising sliders for making it possible to selectively perform processing pertaining to any one of modes; namely,
   a small substrate mounting mode for giving an equal substrate conveyance width to the four conveyors and mounting electronic components on four small substrates having a single width;
   a large substrate mounting mode for actuating all movable paths to the center of the substrate conveyor track and mounting electronic components on two large substrates by means of the remaining fixed paths; and
   a large-small-substrates mounting mode for setting widths of two conveyors on one side of the substrate conveyor track, among the four conveyors, to the same substrate conveyance width as that employed in the small substrate mounting mode, thereby mounting electronic components on the two small substrates and also for actuating the movable paths of the remaining external conveyor closely to the center of the substrate conveyor track, to thus set the width of one of the remaining conveyors to the same substrate conveyance width as that employed in the large substrate mounting mode, thereby mounting electronic components on the large substrate.

3. The electronic component mounting apparatus according to claim 2, further comprising a substrate sorter disposed at an upstream position with respect to the substrate conveyor track, wherein, in the small substrate mounting mode, the substrate sorter preferentially feeds substrates to conveyors located in proximity to the respective component feed units than to the conveyors located at the center of the substrate conveyor track that are distant from the respective component feed units.

* * * * *